United States Patent
Liu et al.

(10) Patent No.: US 9,699,538 B2
(45) Date of Patent: Jul. 4, 2017

(54) MEMS MICROPHONE DEVICE

(71) Applicants: Guojun Liu, Shenzhen (CN); Peng Zeng, Shenzhen (CN); Zhijiang Wu, Shenzhen (CN)

(72) Inventors: Guojun Liu, Shenzhen (CN); Peng Zeng, Shenzhen (CN); Zhijiang Wu, Shenzhen (CN)

(73) Assignee: AAC ACOUSTIC TECHNOLOGIES (SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 14/832,735

(22) Filed: Aug. 21, 2015

(65) Prior Publication Data

US 2016/0212517 A1 Jul. 21, 2016

(30) Foreign Application Priority Data

Jan. 21, 2015 (CN) ...................... 2015 2 0042995 U

(51) Int. Cl.
H04R 1/08 (2006.01)
H04R 1/04 (2006.01)

(52) U.S. Cl.
CPC .......... *H04R 1/04* (2013.01); *H04R 2201/003* (2013.01)

(58) Field of Classification Search
CPC ........................... H04R 1/08; H04R 2201/003
See application file for complete search history.

(56) References Cited

U.S. PATENT DOCUMENTS

| 7,868,402 | B2 * | 1/2011 | Huang | B81B 7/007 257/416 |
| 8,726,496 | B2 * | 5/2014 | Besko | A61B 5/14552 29/831 |
| 8,766,095 | B2 * | 7/2014 | Kenworthy | F16L 11/16 174/102 R |
| 8,965,027 | B2 * | 2/2015 | Bolognia | H04R 1/04 381/175 |
| 9,162,869 | B1 * | 10/2015 | Chen | B81B 7/0064 |
| 2007/0158826 | A1 * | 7/2007 | Sakakibara | B81B 7/0064 257/723 |
| 2008/0283290 | A1 * | 11/2008 | Niino | H05K 9/0001 174/350 |
| 2009/0207976 | A1 * | 8/2009 | Ito | G06K 19/07327 378/156 |
| 2010/0038733 | A1 * | 2/2010 | Minervini | B81B 7/0048 257/416 |

(Continued)

*Primary Examiner* — Brenda Bernardi
(74) *Attorney, Agent, or Firm* — Na Xu; IPro, PLLC

(57) ABSTRACT

A micro-electro-mechanical system (MEMS) microphone device is provided in the present disclosure. The MEMS microphone device includes a circuit board, an electromagnetic shielding cover mounted on the circuit board to define an accommodating space, electronic components received in the accommodating space and electrically connected to the circuit board, and a metal shielding member disposed between the electronic components and the electromagnetic shielding cover. The electromagnetic shielding cover has an inner surface and an outer surface; and at least one of the inner surface and the outer surface is provided with a first metal shielding layer. At least one of the electromagnetic shielding cover and the metal shielding member is electrically connected to the circuit board.

7 Claims, 2 Drawing Sheets

(56) References Cited

U.S. PATENT DOCUMENTS

| | | | |
|---|---|---|---|
| 2010/0284553 A1* | 11/2010 | Conti | B81B 7/0061 381/174 |
| 2012/0237073 A1* | 9/2012 | Goida | H04R 1/02 381/361 |
| 2013/0177180 A1* | 7/2013 | Bharatan | H04R 1/08 381/174 |
| 2014/0017843 A1* | 1/2014 | Jung | B81C 1/00269 438/51 |
| 2014/0050338 A1* | 2/2014 | Kasai | H04R 19/04 381/174 |
| 2014/0072151 A1* | 3/2014 | Ochs | H04R 23/00 381/174 |
| 2014/0191343 A1* | 7/2014 | Kasai | H04R 19/005 257/416 |
| 2015/0001648 A1* | 1/2015 | Lee | H04R 19/04 257/416 |
| 2015/0003659 A1* | 1/2015 | Theuss | H04R 19/005 381/355 |
| 2015/0139467 A1* | 5/2015 | Park | H04R 19/04 381/355 |
| 2015/0264464 A1* | 9/2015 | Okugawa | H04R 19/005 381/174 |
| 2015/0365754 A1* | 12/2015 | Perl | H04R 3/00 381/86 |
| 2016/0037266 A1* | 2/2016 | Uchida | H04R 7/06 381/71.8 |
| 2016/0044396 A1* | 2/2016 | Wang | H04R 1/04 257/416 |
| 2016/0052780 A1* | 2/2016 | Liao | B81C 1/0023 438/51 |
| 2016/0127838 A1* | 5/2016 | Salmon | H04R 19/005 257/416 |
| 2016/0165358 A1* | 6/2016 | Ho | B81B 7/0061 257/416 |
| 2016/0167946 A1* | 6/2016 | Jenkins | B81B 3/0072 257/416 |
| 2016/0192085 A1* | 6/2016 | Lee | B81B 7/007 381/174 |
| 2016/0234604 A1* | 8/2016 | Saxena | H04R 19/04 |

* cited by examiner

MEMS MICROPHONE DEVICE

FIELD OF THE DISCLOSURE

The present disclosure generally relates to microphone technologies, and more particular, to a micro-electro-mechanical system (MEMS) microphone device with a high electromagnetic shielding performance.

BACKGROUND

Microphones are applied in various electronic products for converting sound into electrical signals. Compared with other types of microphones, a MEMS microphone is widely used by virtue of some advantages such as small size and low weight. However, because a MEMS microphone needs to receive sound in the air, the MEMS speaker device is apt to suffer electromagnetic interference of environmental electromagnetic waves. This may decrease sound reception quality of the MEMS speaker device.

Therefore, it is desired to provide a MEMS microphone device which can overcome the aforesaid problems.

BRIEF DESCRIPTION OF THE DRAWINGS

Many aspects of the embodiment can be better understood with reference to the following drawings. The components in the drawing are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

The present disclosure will be described in detail below with reference to the attached drawings and the embodiment thereof.

Figure 1:
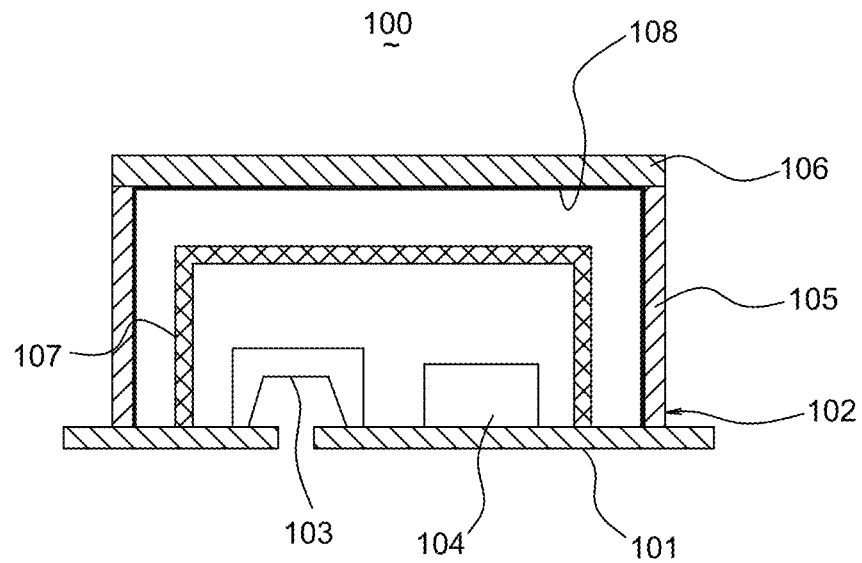
FIG. 1 is a schematic, cross-sectional view of a MEMS microphone device according to a first embodiment of the present disclosure.

FIG. 1 illustrates a MEMS microphone device 100 according to a first embodiment of the present disclosure. The MEMS microphone device 100 is applicable to an electronic apparatus such as a smart phone, a tablet computer, or the like. The MEMS microphone device 100 includes a circuit board 101, an electromagnetic shielding cover 102, and electronic components including a MEMS chip 103 and an application specific integrated circuit (ASIC) chip 104.

The electromagnetic shielding cover 102 is mounted on a main surface of the circuit board 101 and cooperates with the circuit board 101 to form an accommodating space. The MEMS chip 103 and the ASIC chip 104 are both received in the accommodating space, and are electrically connected to the circuit board 101.

The electromagnetic shielding cover 102 includes a main frame 105 and a cover plate 106. The main frame 105 includes a plurality of sidewalls, which are connected in an end-to-end manner and thereby defining a top opening and a bottom opening. The cover plate 106 is fixed on the main frame 105 and covers the top opening of the main frame 105; and the bottom opening of the main frame 105 is covered by the circuit board 101 when the electromagnetic shielding cover 102 is mounted on the circuit board 101.

A surface of the electromagnetic shielding cover 102, which faces the accommodating space, is defined as an inner surface, while an opposite surface of the electromagnetic shielding cover 102, which is far away from the accommodating space, is defined as an outer surface. In the present embodiment, a metal shielding layer 108 is coated on the inner surface of the electromagnetic shielding cover 102, the metal shielding layer 108 is adapted for shielding the electronic components (including the MEMS chip 103 and the ASIC chip 104) within the accommodating space, and thus prevent these internal electronic components from suffering electromagnetic interference of surrounding electromagnetic waves.

Alternatively, in another embodiment, the metal shielding layer 108 may be coated on the outer surface of the electromagnetic shielding cover 102; in yet another embodiment, both the inner surface and the outer surface of the electromagnetic shielding cover 102 may be coated with metal shielding layer 108 respectively.

Moreover, the MEMS microphone 100 may further includes a metal shielding shell 107 in the accommodating space, the metal shielding shell 107 is disposed between the electronic components (including the MEMS chip 103 and the ASIC chip 104) of the MEMS microphone 100 and the electromagnetic shielding cover 102, and covers the electronic components. The metal shielding shell 107 is adapted for providing additional electromagnetic shielding protection for the MEMS chip 103 and the ASIC chip 104. In the present embodiment as illustrated in FIG. 1, the metal shielding shell 107 is separate from the electromagnetic shielding cover 102, and thus a gap is formed between the inner surface of the electromagnetic shielding cover 102 and the metal shielding shell 107.

It is noted that the metal shielding shell 107 may alternatively be attached to the inner surface of the electromagnetic shielding cover 102. For example, in one embodiment, the metal shielding shell 107 may be partly attached to the inner surface of the electromagnetic shielding cover 102 by multiple contact points, one or more contact line, or other contact pattern; in another embodiment, the metal shielding shell 107 may be fully attached to the inner surface of the electromagnetic shielding cover 102. In addition, the attachment between the metal shielding shell 107 and the inner surface of the electromagnetic shielding cover 102 may be realized by using conductive material, nonconductive material, glue material or other mechanical or physical connection.

Furthermore, at least one of the metal shielding shell 107 and the electromagnetic shielding cover 102 is electrically connected to the circuit board 101. For example, in the present embodiment, the metal shielding layer 108 of the electromagnetic shielding cover 102 is electrically connected to the circuit board 101, while the metal shielding shell 107 is insulated from the circuit board 101, in other words, no electrical connection exists between the metal shielding shell 107 and the circuit board 101. In another embodiment, the metal shielding shell 107 may be electrically connected to the circuit board 101, and in this circumstance, the electromagnetic shielding cover 102 may either be insulated from the circuit board 101 or electrically connected to the circuit board 101.

Figure 2:
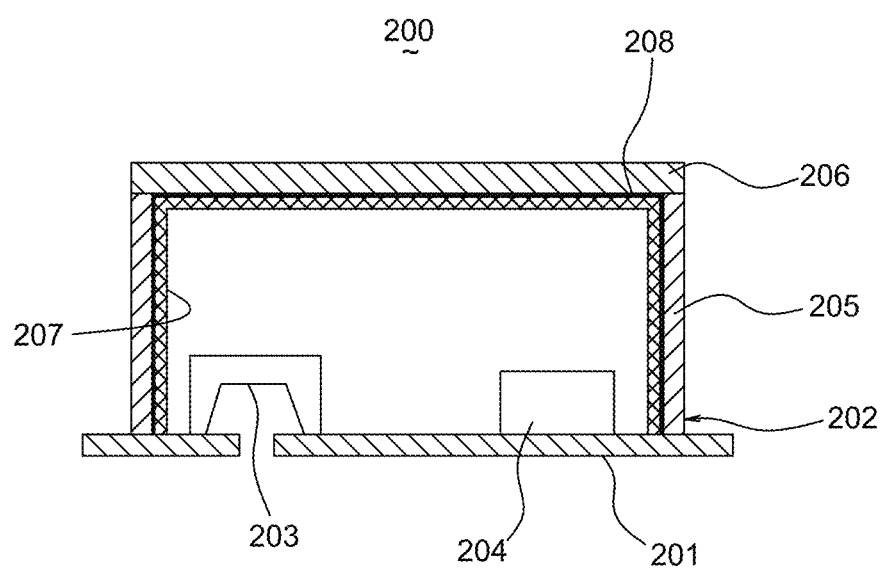
FIG. 2 is a schematic, cross-sectional view of a MEMS microphone device according to a second embodiment of the present disclosure.

FIG. 2 illustrates a MEMS microphone device 200 according to a second embodiment of the present disclosure.

The MEMS microphone device 200 is similar to the above-described MEMS microphone device 100 as illustrated in FIG. 1, but mainly differs in that the metal shielding shell 107 is replaced by another metal shielding layer 207.

Specifically, the MEMS microphone device 200 includes a circuit board 201, an electromagnetic shielding cover 202 mounted on the circuit board 201 to form an accommodating space, a MEMS chip 203 and an ASIC chip 204 received in the accommodating space and electrically connected to the circuit board 201.

The electromagnetic shielding cover 202 includes a main frame 205 and a cover plate 206 covering the main frame 205. An inner surface of the electromagnetic shielding cover 202 is coated with a first metal shielding layer 208, and a second metal shielding layer 207 is further coated on the first metal shielding layer 208. Material of the second metal shielding layer 207 is different from that of the first metal shielding layer 208, so that the second metal shielding layer 207 can provide additional electromagnetic shielding protection for the MEMS chip 203 and the ASIC chip 204.

Moreover, at least one of the first metal shielding layer 208 and the second metal shielding layer 207 is electrically connected to the circuit board 201, for example, in the present embodiment, the first metal shielding layer 208 is electrically connected to the circuit board 201 while the second metal shielding layer 208 is not electrically connected to the circuit board 201.

Figure 3:
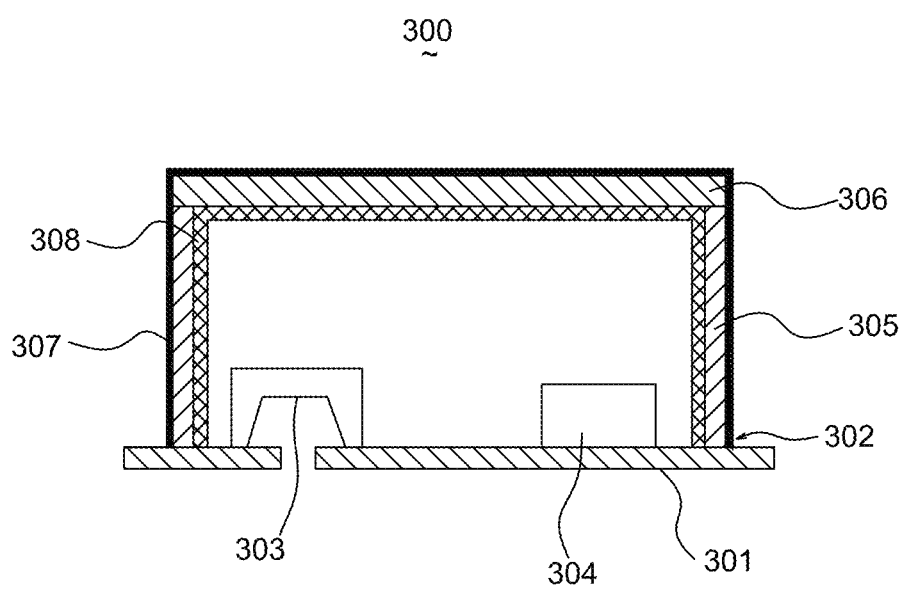
FIG. 3 is a schematic, cross-sectional view of a MEMS microphone device according to a third embodiment of the present disclosure.

FIG. 3 illustrates a MEMS microphone device 300 according to a second embodiment of the present disclosure. The MEMS microphone device 300 is similar to the above-described MEMS microphone device 200 as illustrated in FIG. 2, but mainly differs in that a first metal shielding layer 307 and the second metal shielding layer 308 are respectively coated on two opposite surface of an electromagnetic shielding cover 302 of the MEMS microphone device 300.

Specifically, the MEMS microphone device 300 includes a circuit board 301, an electromagnetic shielding cover 302 mounted on the circuit board 301 to form an accommodating space, a MEMS chip 303 and an ASIC chip 304 received in the accommodating space and electrically connected to the circuit board 301.

The electromagnetic shielding cover 302 includes a main frame 305 and a cover plate 306 covering the main frame 305. The first metal shielding layer 307 is coated on an outer surface of the electromagnetic shielding cover 302, and the second metal shielding layer 308 is coated on an inner surface of the electromagnetic shielding cover 302. Since the second metal shielding layer 308 are not formed on the first metal shielding layer 307, in the present embodiment, material of the first metal shielding layer 307 can be either the same as that of the second metal shielding layer 308 or different that of the second metal shielding layer 308.

Moreover, at least one of the first metal shielding layer 307 and the second metal shielding layer 308 is electrically connected to the circuit board 301, for example, in the present embodiment, the first metal shielding layer 307 is electrically connected to the circuit board 301 while the second metal shielding layer 308 is not electrically connected to the circuit board 301.

It is to be understood, however, that even though numerous characteristics and advantages of the present embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A micro-electro-mechanical system (MEMS) microphone device, comprising:
    a circuit board;
    an electromagnetic shielding cover mounted on the circuit board to define an accommodating space, the electromagnetic shielding cover comprising an inner surface and an outer surface; and
    electronic components received in the accommodating space and electrically connected to the circuit board, the electronic components comprising a MEMS chip and an application specific integrated circuit (ASIC) chip;
    wherein at least one of the inner surface and the outer surface is provided with a first metal shielding layer, and the MEMS microphone device further comprises a metal shielding member disposed between the electronic components and the electromagnetic shielding cover;
    wherein at least one of the electromagnetic shielding cover and the metal shielding member is electrically connected to the circuit board; the metal shielding shell is totally separate from the electromagnetic shielding cover so that a gap exists between the electromagnetic shielding cover and the metal shielding shell.

2. The MEMS microphone device of claim 1, wherein the metal shielding member is a metal shielding shell covering the MEMS chip and the ASIC chip.

3. The MEMS microphone device of claim 1, wherein the electromagnetic shielding cover is electrically connected to the circuit board via the first metal shielding layer, and the metal shielding member is insulated from the circuit board.

4. The MEMS microphone device of claim 1, wherein the metal shielding member is electrically connected to the circuit board, and the electromagnetic shielding cover is insulated from the circuit board.

5. The MEMS microphone device of claim 1, wherein both of the metal shielding member and the electromagnetic shielding cover are electrically connected to the circuit board.

6. The MEMS microphone device of claim 1, wherein material of the electromagnetic shielding cover is different from that of the metal shielding member.

7. The MEMS microphone device of claim 1, wherein material of the electromagnetic shielding cover is the same as that of the metal shielding member.

\* \* \* \* \*